METHOD FOR DICING SEMICONDUCTOR MATERIAL

Filed Sept. 11, 1961 2 Sheets-Sheet 1

INVENTORS
Bernard F. Kalvelage
Albert W. Coe
BY
Mueller & Aichele
ATT'YS.

May 11, 1965 B. F. KALVELAGE ETAL 3,182,873

METHOD FOR DICING SEMICONDUCTOR MATERIAL

Filed Sept. 11, 1961 2 Sheets-Sheet 2

INVENTORS
Bernard F. Kalvelage
Albert W. Coe
BY
Mueller & Aichele
ATT'YS.

United States Patent Office 3,182,873
Patented May 11, 1965

3,182,873

METHOD FOR DICING SEMICONDUCTOR MATERIAL

Bernard F. Kalvelage and Albert W. Coe, both of Phoenix, Ariz., assignors to Motorola, Inc., Chicago, Ill., a corporation of Illinois Filed Sept. 11, 1961, Ser. No. 137,094
2 Claims. (Cl. 225—2)

This invention relates to the processing of semi-conductor material to form semiconductor units, and in particular relates to a method and apparatus for dividing thin wafers of semiconductor material into individual die units which are referred to collectively as dice.

One known way of accomplishing the division of semiconductor wafers is by first scribing the wafer to form a grid-like pattern of lines or grooves on it, and then flexing the wafer such that it breaks along the scribe lines into pieces which represent dice. A method of this type is described and claimed in Patent No. 2,970,730 of F. W. Schwarz which is assigned to the present assignee. In the method of that patent, a curved member is employed to flex the wafer after it has been scribed. Although this is completely satisfactory for many applications, it has been difficult to achieve high production rates. When a curved member such as a cylindrical anvil or roller is employed, the wafer must be flexed first in one direction and then in the other direction, and the operation must be reasonably careful in order to minimize damage to and contamination of the dice. Although the desirability of mechanizing the dicing operation has been recognized, the requirement for flexing the wafer successively in two directions has held back efforts to accomplish such mechanization.

An object of this invention is to provide a method and apparatus for breaking scribed semiconductor wafers into dice at a considerably higher production output rate than can be achieved with presently available methods and apparatus.

Another object of the invention is to provide a method and apparatus for dicing scribed semiconductor wafers which produces no damage to the dice and is not subject to errors in operators technique.

A feature of the invention is a method of dicing a semiconductor wafer in which the wafer is flexed only once by applying pneumatic pressure to it in a controlled manner such that high production rates can be achieved while maintaining a high yield of commercially acceptable dice.

Another feature of the invention is the provision of a pneumatic wafer breaking apparatus which has an upwardly facing concave wafer holder and a flexible diaphragm which is forced down on to the top of the wafer by air pressure, thereby causing the wafer to break along all the scribed lines into individual dice. The dicing is accomplished quickly without damaging the dice simply by placng the wafer in the concave holder and actuating the pneumatic system which applies pressure to the wafer through the diaphragm.

Referring to the drawings.

Figure 1:
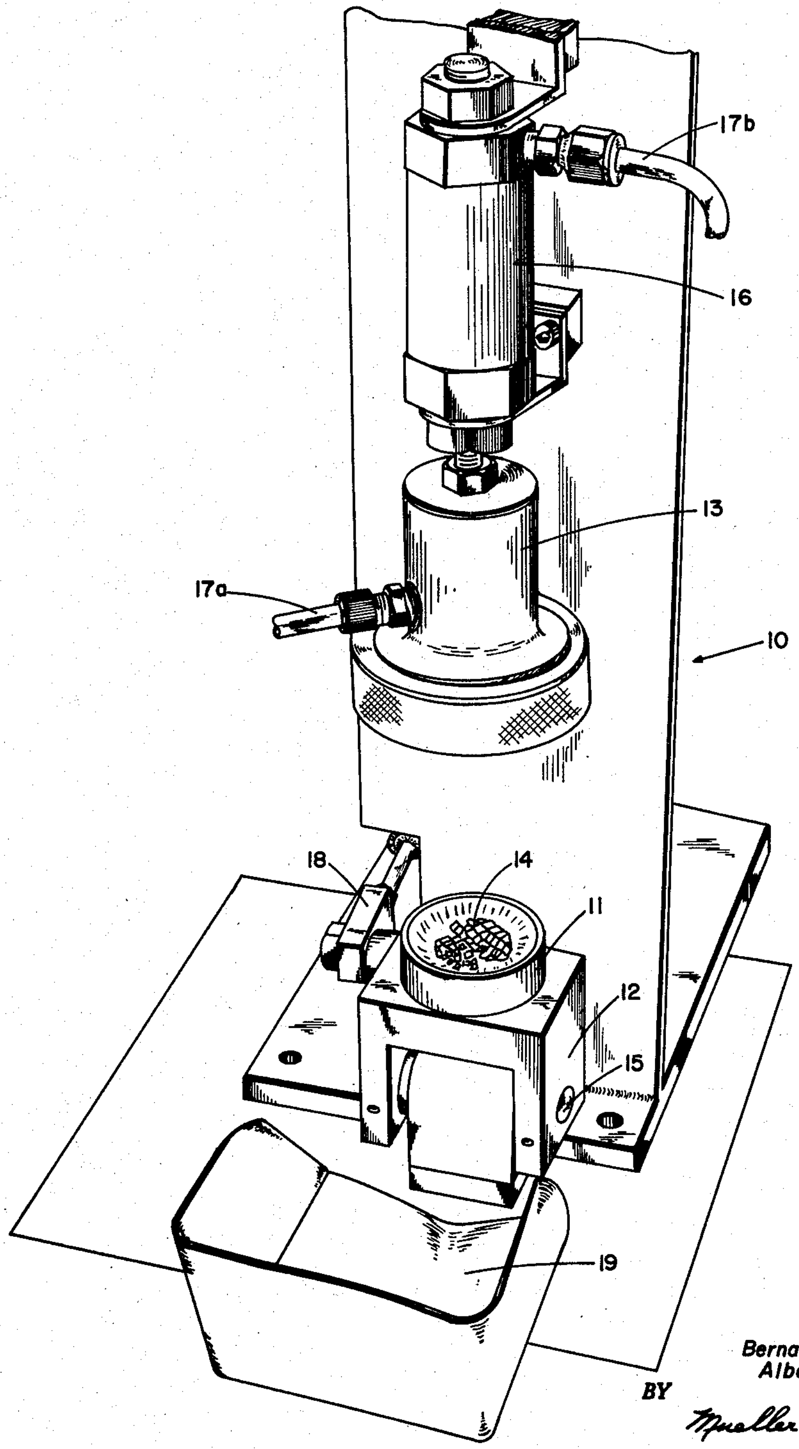
FIG. 1 is a fragmentary perspective view of the wafer breaking apparatus with its breaking head in a raised position, and shows a hopper which receives the individual dice.
Figure 3:
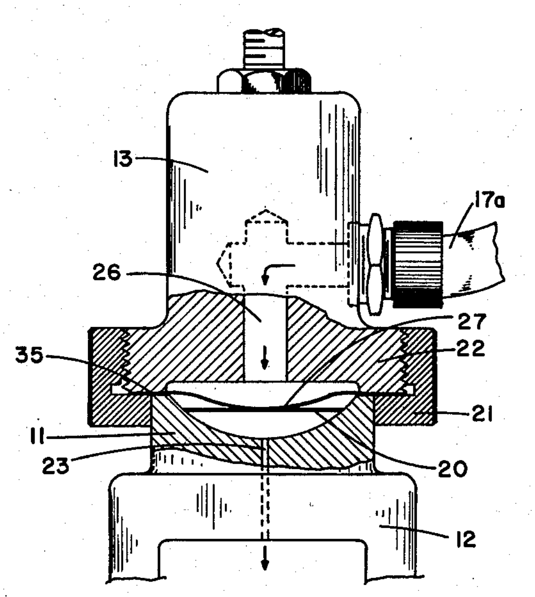
Figure 4:
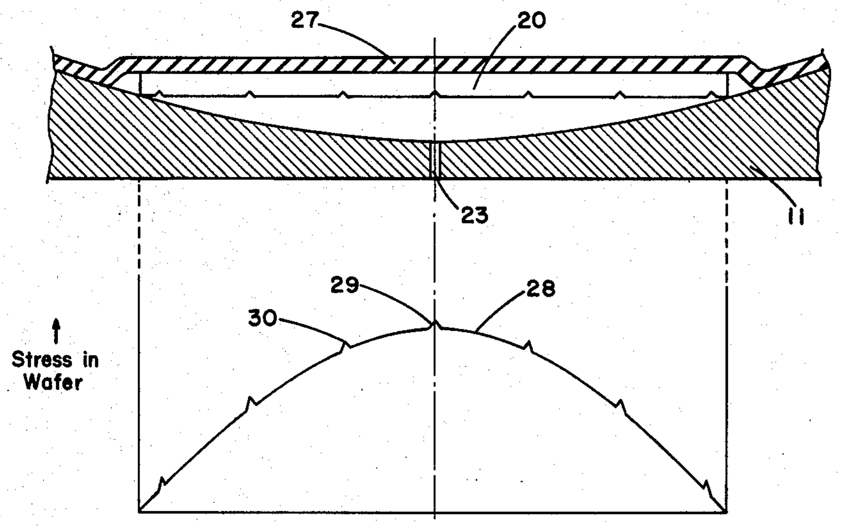

FIG. 3 is a view partly in section of the portion of the apparatus of FIG. 1 which accomplishes the breaking and shows a breaking head in a lowered position in which it is sealed to a holder for supporting a wafer and the dice which result from breaking the wafer; and FIG. 4 is a graph showing the stress existent in the semiconductor wafer at a moment just prior to any breaking of the wafer, but with a diaphragm included in the breaking head under pressure and in full contact with the upper face of the wafer.

The wafer breaking apparatus 10 includes a wafer holder 11 and a pivoting support 12 which supports the wafer holder. A breaking head 13 is located above the holder 11, and the head 13 is driven downwardly to seat it on the holder by means of a driving cylinder 16. There is an air inlet 17*a* attached to the head 13 for applying pressure to a wafer in the holder 11, and another air inlet 17*b* for supplying air to actuate the driving cylinder 16. An arm 18, actuated by another air cylinder (not shown), drives the pivoting support 12 to dump the dice into a hopper 19 in which the individual dice are temporarily stored after breaking.

Figure 2:
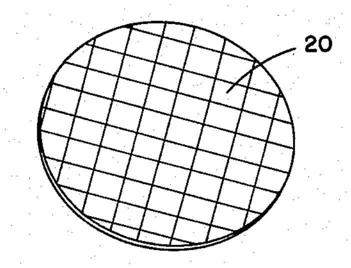
FIG. 2 shows a scribed semiconductor wafer which is ready to be placed in the wafer breaking apparatus.

The semiconductor dice 14 shown in the holder 11 in FIG. 1 have been formed from a semiconductor wafer 20 of the type shown in FIG. 2. There are scribed lines on the face of the wafer which define the die units. These lines have been scribed into the semiconductor material to a depth of approximately .5 thousandths of an inch by the method described in Patent No. 2,970,730 referred to above. The wafer 20 is typically about 5 to 10 thousandths of an inch thick. The scribed lines extend in two directions at right angles to each other, and thus define square dice which are typically 70 to 125 mils on each side. Such dice are useful in rectifiers and diodes, for example, and it is not necessary that they be retained in any particular orientation after they are formed.

FIG. 3 is a cross-sectional view showing the details of the breaking head 13, the wafer holder 11 and the pivoting structure 12. A flexible diaphragm 27 is contained within the pressure head 13 and is held tightly between a collar 21 and the breaking head body 22. The wafer holder 11 has a small air relief hole 23 which permits a controlled reduction of pressure below the wafer and thus improves the breaking action of the diaphragm 27. The surface of the holder which faces the wafer is concave and has a generally spherical or dished shape. Air is introduced to the breaking head through the air inlet 17*a* and passes down into the head through the channel 26 in the breaking head 13. The semiconductor wafer 20 is shown in place in the wafer holder 11 and is in the unbroken condition with the diaphragm 27 just starting to exert pressure on the wafer. Wafers of any shape can readily be broken in the apparatus. When a wafer is put in the holder 11 no particular orientation is necessary.

The cycle of operation of the wafer breaking apparatus will now be described. Referring to FIGS. 1 and 2, a scribed semiconductor wafer 20 is placed in an approximately horizontal position in the upwardly facing concave wafer holder 11 with the scribed lines on the wafer facing downward. At this time the breaking head 13 is in a raised position permitting easy access to the wafer holder 11. The air cylinder 16 is actuated to drive the breaking head downwards until the head comes into firm contact with the upper horizontal face of the wafer holder 11. This condition of the apparatus can be readily seen in FIG. 3. A tight seal is made between the breaking head 13 and the upper faces of the wafer holder 11 since these two parts are sealed together by the flexible diaphragm 27 at the point 35. Air pressure of approximately 15 pounds per square inch is then introduced through the air inlet 17*a*. The specific air pressure that is employed depends on the properties and dimensions of the wafer. Wafers having a closer spacing between the scribed lines require a greater pressure to accomplish satisfactory breaking. This pressure causes the diaphragm 27 to push downwards on the top of wafer 20 causing the wafer to break into successively smaller and smaller pieces at the scribed lines, thus forming all of the individual dice. At this point the air pressure to the air inlet 17*a* is removed and a spring return (not shown) causes the breaking head 13 to move upwards into a rest position. The dice 14 (see FIG. 1) are ready to be removed from the wafer holder 11. Another air cylinder which is not shown, causes actuation of the pivoting lever 18 (FIG. 1) which causes the pivoting support 12 to be driven forward and the dice 14 are dumped into the receiving hopper 19 and are ready to be moved to a subsequent assembly operation.

The upper part of FIG. 4 is a highly enlarged view of the scribed semiconductor wafer 20 in position in the wafer holder 11 and shows the condition of the flexible diaphragm 27 at the time the air pressure has forced it against the upper face of the wafer. The relative stress which has developed within the wafer is shown in the lower part of FIG. 4 by the curve 28. Stress values are plotted for all points across the wafer starting at the left edge of the wafer and proceeding from left to right across to the right edge of the wafer. It should be noted that at the regions where the wafer is scribed the stress is greater and these regions are indicated by the peaked stress values such as are shown at 29 and 30. At the moment just prior to the first breaking action the maximum stress applied to the wafer is at its center, so the wafer breaks first at a central scribed line. As successive portions of the wafer are broken, the maximum stress still exists at a scribed line at the center of any remaining unbroken portions of the wafer. Each piece of the wafer is supported by the holder only at its periphery, so the bulk of the piece is free to be deflected. Thus, with continued application of pneumatic pressure the wafer breaks into smaller and smaller pieces until finally it has broken at all of the scribed lines and the final dice are formed. The actual breaking process takes place very rapidly and requires only approximately 10 milliseconds.

It should be noted that the semiconductor material, usually crystalline germanium or silicon, is very strong and yet quite brittle, and this requires an unusual approach in order to break it into dice without damaging the material. The semiconductor material is comparable with toughened glass from the standpoint of equivalent hardness, strength and brittleness.

The method and apparatus of the invention accomplishes the dicing of semiconductor wafers at high production rates. Only a single application of force on the wafer is required, and this contributes significantly to the effectiveness of the processing and facilitates the mechanization of the dicing operation. Also, successful operation of the apparatus does not depend on the skill or attentiveness of an operator, and a high yield of satisfactory dice is obtained consistently.

We claim:

1. A method of breaking a thin, flat, circular member which is hard and brittle into a plurality of four-sided units defined by scribed lines in one surface of said member, said method including placing said member on a concave, generally spherical surface of a holder so that only the circular edge of said member contacts said surface leaving the remainder of said member free to be deflected toward said surface, placing and retaining a flexible diaphragm adjacent the side of said member which faces away from said holder surface, and forcing said diaphragm against said member with gas pressure to break said member into pieces defined by scribed lines therein and press such pieces against said holder surface until all of said four-sided units are formed by breakage at said scribed lines.

2. A method of breaking a circular semiconductor wafer into a plurality of four-sided die units defined by a first set of parallel scribed lines and a second set of parallel scribed lines perpendicular to the first set, all scribed in one side of said wafer, said method comprising supporting said wafer only at the edge thereof with a concave surface of a holder while leaving all other portions of said wafer free to be deflected toward said concave surface, placing a flexible diaphragm at the side of said wafer opposite said holder, and applying gas under pressure to said diaphragm to force said diaphragm against said wafer and force said wafer against said concave surface until all of said four-sided die units are formed by breakage at said scribed lines.

References Cited by the Examiner

UNITED STATES PATENTS

| | | | |
|---|---|---|---|
| 1,920,641 | 8/33 | Heichert | 225—2 |
| 2,249,325 | 7/41 | Pruckner | 225—96 |
| 2,291,451 | 7/42 | Craig et al. | 225—2 |
| 2,295,052 | 9/42 | Rosa | 225—2 |
| 2,340,733 | 2/44 | Clark | 73—102 |
| 2,354,323 | 7/44 | Layton | 225—96 |
| 2,525,345 | 10/50 | Getchell | 73—102 |
| 2,970,730 | 2/61 | Schwarz | 225—2 |
| 3,040,489 | 6/62 | Costa | 53—21 |

ANDREW R. JUHASZ, *Primary Examiner.*

RAPHAEL M. LUPO, WILLIAM W. DYER, Jr., *Examiners.*